United States Patent [19]
Boysel et al.

[11] Patent Number: 5,192,395
[45] Date of Patent: Mar. 9, 1993

[54] METHOD OF MAKING A DIGITAL FLEXURE BEAM ACCELEROMETER

[75] Inventors: Robert M. Boysel; Jeffrey B. Sampsell, both of Plano, Tex.

[73] Assignee: Texas Instruments Incorporated, Dallas, Tex.

[21] Appl. No.: 596,841

[22] Filed: Oct. 12, 1990

[51] Int. Cl.$^5$ .......................... B44C 1/22; C23F 1/00
[52] U.S. Cl. .................................. 156/643; 156/656; 156/645
[58] Field of Search ............... 156/643, 644, 645, 652, 156/653, 655, 656, 657, 659.1, 662, 668; 73/517 R, 517 AV

[56] References Cited

U.S. PATENT DOCUMENTS

| | | | |
|---|---|---|---|
| 4,553,436 | 11/1985 | Hansson | 73/517 R |
| 4,566,935 | 1/1986 | Hornbeck | 156/657 X |
| 4,662,746 | 5/1987 | Hornbeck | 350/269 |
| 4,710,732 | 12/1987 | Hornbeck | 350/269 X |
| 4,855,544 | 8/1989 | Glenn | 200/61.45 R |
| 4,954,789 | 9/1990 | Sampsell | 350/487 X |
| 4,956,619 | 9/1990 | Hornbeck | 350/310 X |

FOREIGN PATENT DOCUMENTS 2626077  7/1989  France .

OTHER PUBLICATIONS

"Accelerometer Systems with Self-Testable Features", Allen, et al. *Sensors and Actuators*, vol. 20, 1989, pp. 153-161.

"A Miniature Silicon Accelerometer with Build-In Dumping", Stephen Terry, paper written for presentation.

*Primary Examiner*—William A. Powell
*Attorney, Agent, or Firm*—Julie L. Reed; James C. Kesterson; Richard L. Donaldson

[57] ABSTRACT

It is possible to determine acceleration using an array of micro-machined elements. The invention described herein details how to do so by fabricating an array of structures with a substrate, addressing circuitry, a spacer layer forming a well over the addressing circuitry, and a deflection element over the well. The deflection elements are configured so each element is deflected by a higher acceleration. The invention also shows one embodiment of the invention.

8 Claims, 4 Drawing Sheets

METHOD OF MAKING A DIGITAL FLEXURE BEAM ACCELEROMETER

BACKGROUND OF THE INVENTION

1. Field of the Invention

This invention deals with accelerometers, more particularly with digital accelerometers.

2. Description of the Prior Art

Current accelerometers in use are typically of one of two types. The first type uses strain-sensing techniques. These have piezo-electric or piezo-resistive material that senses either the stress induced by the inertial mass, or the strain induced by the spring supporting the mass. The second type are position-sensing. These measure the displacement of an accelerated mass connected to a restoring spring.

Both of these methods measure the analog response of the transducer to the acceleration to output a proportional signal. Therefore, the linearity and range of these accelerometers is dependent on the materials, architecture and transduction phenomena of the sensor.

These type of accelerometers typically have a sensor element with a mass on the order of a gram. Hybrid techniques are necessary to integrate the transducer with the readout circuitry. These two factors contribute to two problems with this type of accelerometers. They are large in size, by integrated circuit standards. Also, they require expensive tail-end processing, making them expensive by semiconductor industry standards.

These problems have lead to the manufacture of anew type of accelerometers. These typically have masses and springs fabricated from single crystal or polycrystalline silicon. The sensors are on a silicon dioxide membrane. The silicon substrate is etched away with an anisotropic or orientation-dependent etch. The supporting oxide is then freed by wet-etching with hydrofluoric acid.

While this technique is an improvement over the hybrid techniques discussed above, this method produces a single element that is 1 millimeter in size. That measurement does not include the addressing circuitry, which must be put on the side, since the substrate has been removed underneath.

Therefore, it is an object of this invention to provide micro-machined accelerometers.

It is another object of this invention to provide an inexpensive process for manufacturing micro-machined accelerometers including the addressing circuitry.

SUMMARY OF THE INVENTION

Other objects and advantages will be obvious, and will in part appear hereinafter and will be accomplished by the present invention which provides a structure for the detection and quantification of acceleration. This structure comprises a substrate upon which is built a ground plane which in turn has addressing circuitry upon it. The addressing circuitry has metal contacts located below a well, over which is suspended an array of deflection elements. Each deflection element has a mass upon it, said mass deposited and patterned in such a way that the elements progress from a heavier mass to a lighter mass. The invention determines acceleration by locating the first mass to be undeflected by the acceleration.

BRIEF DESCRIPTION OF THE DRAWINGS

For a complete understanding of the invention, and the advantages thereof, reference is now made to the following description in conjunction with the accompanying drawings, in which.

DETAILED DESCRIPTION OF THE DRAWINGS

Figure 1:
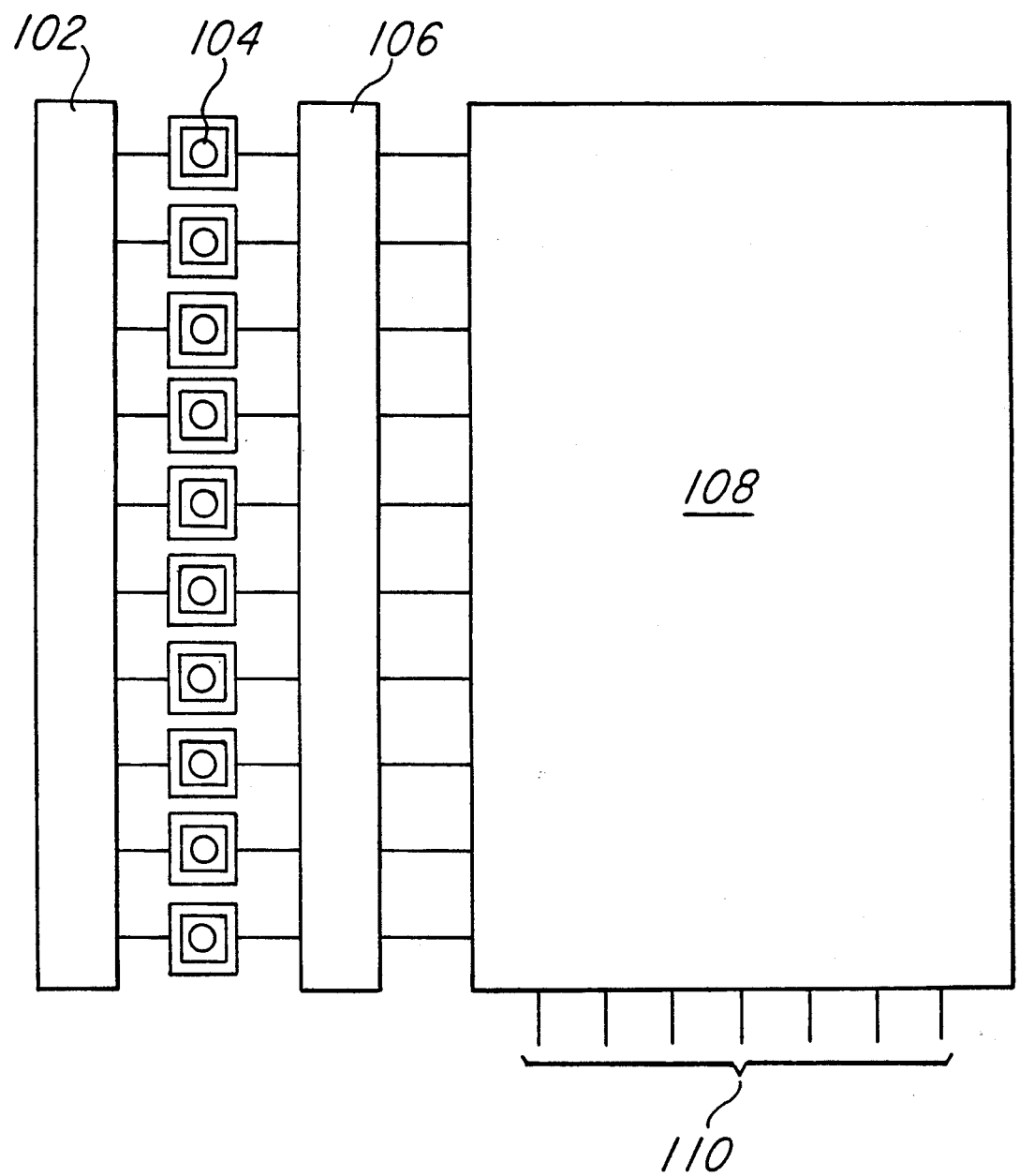
FIG. 1 shows the block diagram of the accelerometer chip.

FIG. 1 is a block diagram of the accelerometer. The CMOS (Complementary Metal Oxide Semiconductor) shift register 102 pulses the array of deflection elements 104. If an element is deflected, it grounds the shift register pulse, causing a high signal to be passed to the comparator array 106. If an element is not deflected, the a low pulse is passed. The deflection elements are constructed such that they progress from a higher mass to a lower mass. This enables the elements in the array to be deflected by lower accelerations and the elements with a lower mass require higher accelerations. Each acceleration then has a set of masses it is capable of deflecting, and a set that it is not capable of deflecting. The comparator array 106 then compares the incoming signals for a difference between two, one low and one high. This is the transition point of the acceleration. The transition point is then passed on as a high signal to the decoder 108. The decoder then takes the high signal and generates a unique seven-bit word corresponding to the value of the acceleration.

Figure 2:
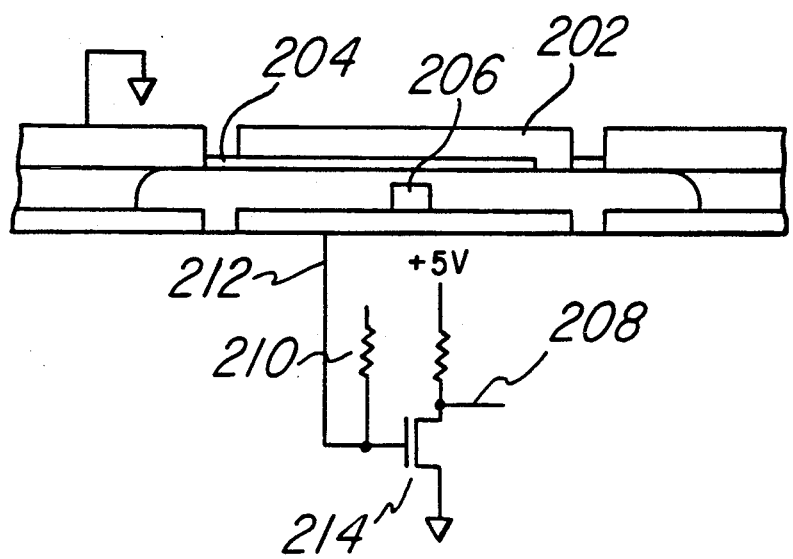
FIG. 2 is a cross-sectional view of a single accelerometer element showing the circuit.

FIG. 2 shows a cross-sectional view of one of the elements in the deflection array. Line 210 is pulsed high from the shift register. If mass 202 is sufficiently deflected on hinge 204, it touches contact 206. This then grounds the line 212, sending a low signal. This causes the transistor 214 to turn off and pass a high signal onto line 208. Line 208 connects to the comparator array circuitry, which includes latches to hold the deflection element output.

Figure 3:
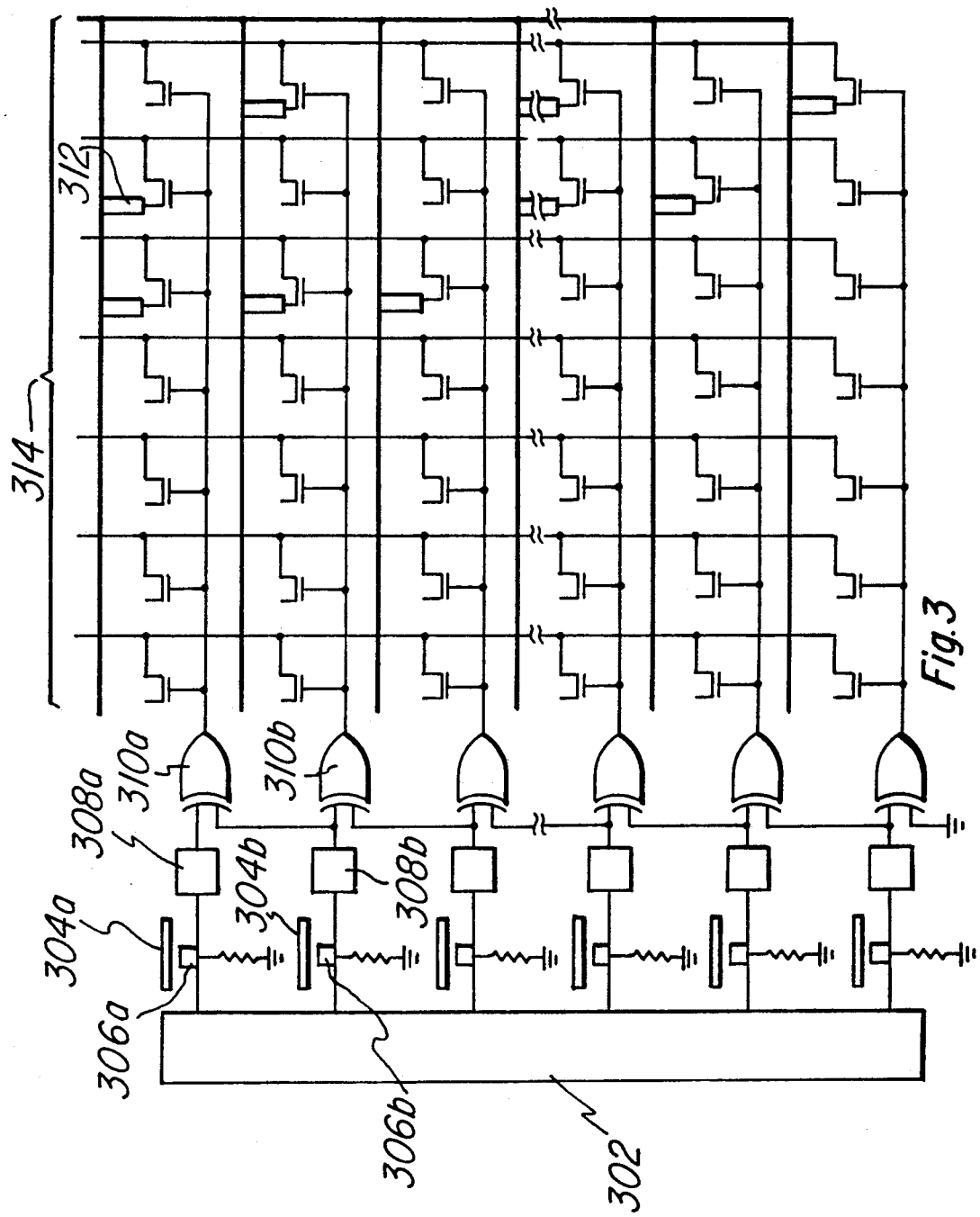
FIG. 3 shows a portion of the addressing and encoding circuitry.

A portion of the NMOS (N-channel Metal Oxide Semiconductor) decoding and addressing circuitry is shown in FIG. 3. The CMOS shift register 302 pulses high signals. If element 304B is deflected and touches grounded contact 306B, the high signal is grounded and a high signal is passed. Latch 308B is used to hold the signals for the comparator array.

After the signal is latched at 308B, it is passed into the exclusive OR gates (XOR) 310B and 310A. At the same time the signal from deflection element 304A is latched into 308A. the signal from 308A is then passed to the XOR gate 310A. If the signals from 308A and 308B are both low, 310A will output a low signal. If 308B is low (deflected), and 308A is high (undeflected), and the fault checking shows this to be true transition, the output will be a high signal. The high signal is then passed into the decoding circuitry. Through a series of transistors uniquely jumpered together as seen by 312, the single high signal is used to generate a unique digital word. This word is output through the wires 314.

Figure 4:
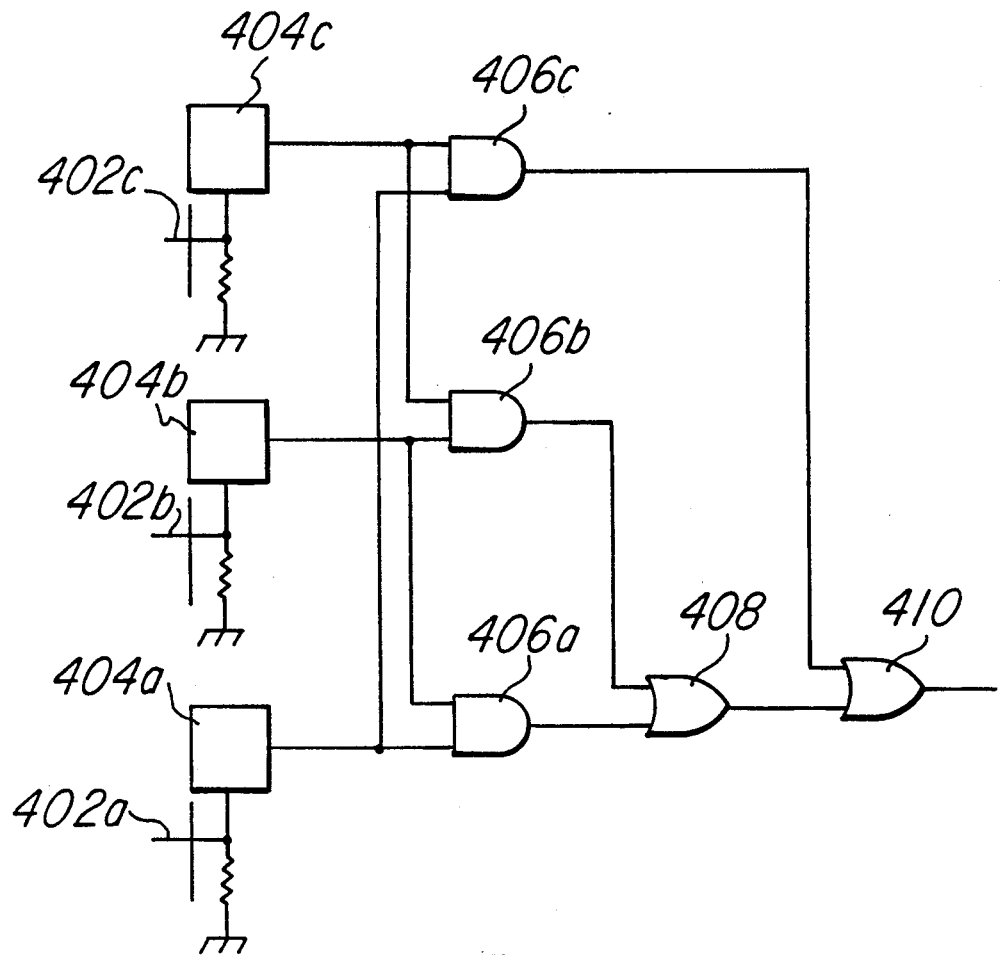
FIG. 4 shows the fault tolerant circuitry.

FIG. 4 shows an embodiment of fault tolerant circuitry using the redundant elements 402A, 402B and 462C. The monolithic manufacture of these elements reduces the possibility of defective elements and increases the chip yield. Yet it is still wise to incorporate some method for checking for stuck elements. The increased yield allows for redundant columns of elements to be produced.

If two transitions are detected, and the signals are latched, then redundant elements of both transitions can be checked. If, for example, element 402A deflects but 402B and 402C do not. Latch 404A holds a high signal, while 404B and 404C hold lows. AND-gates 406A, 406B and 406C then output a low. OR-gate 408 takes the low signal from 406A and the low signal for 406B and produces a low. OR-gate 410 then takes the low from 408 and the low from 406C and outputs a low. Two of the elements in the column are low signals, meaning undeflected elements, and one is high meaning a deflected element. Since they are all supposed to be the same state, this leads to the conclusion that 402A is stuck in the deflected position. This eliminates a false reading for the transition point.

Figure 5:
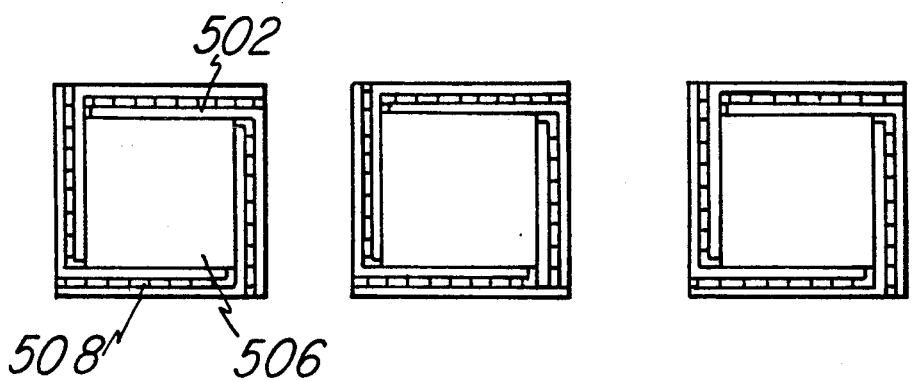
FIG. 5 shows the top view of a portion of the accelerometer element array.

A top view of a few of the deflection elements is shown in FIG. 5. The mass 506, in this case tungsten is supported on hinges 502. The hinges are sitting on support metal 508. The support posts used in typical flexure beam deformable mirror devices (DMDs) can be used, but are not necessary. Since the only output of interest is the contact made at the underlying surface, the degree of deflection is not important, as long as contact is made.

Figure 6:
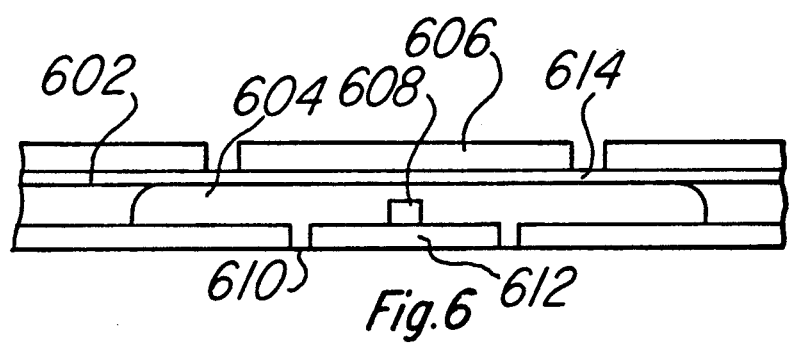
FIG. 6 shows the processing levels in a cross-section of a single element.

A side view of the sensor elements are shown in FIG. 6. The fabrication process is very similar to that of DMDs. The address circuitry 612 is built upon the ground plane 610. The oxide contact 608 is then fabricated upon the address circuitry. A polymer spacer 604 is spun on the entire wafer. A thin layer of hinge aluminum 602 is deposited and the deflection element 614, including hinges and plate is photolithographically patterned and plasma etched. A thick layer of tungsten is deposited and formed differently for each element as the deflection mass 606.

The deflection differences can be done in one of many ways. According to one method, the tungsten can be patterned so a different mass is on each deflection element. Alternately, different thickness of hinges can be used with the same masses on each. Either method will achieve the desired effect of a different deflection for each element, dependent on the acceleration.

In the preferred embodiment, the element consists of a square of aluminum alloy approximately 50 $\mu$m on a side. The square is supported on four sides by narrow hinges. This causes the square to be limited to movement only up and down in a piston-like movement. Modelling of the acrhitecture indicates that sensitivity to accelerations in the range of 1 $m/s^2$ to 100 $m/s^2$ can be obtained with hinges approximately 50 $\mu$m long, 1 $\mu$m wide and 650 A thick. The mass of the element is determined by a photolithographically patterned tungsten mass 1-2 $\mu$m thick deposited on the aluminum element.

Thus, although there has been described to this point a particular embodiment for a circuit to be used as an accelerometer, it is not intended that such specific references be considered as limitations upon the scope of this invention except in-so-far as set forth in the following claims.

What is claimed is:

1. A process for fabrication of sensor elements comprising the following:
   a) forming a ground plane layer upon a substrate;
   b) fabricating addressing circuitry and electrical contacts upon said ground plane;
   c) spinning a spacer layer upon the entire substrate;
   d) depositing a layer of thin metal upon said spacer layer;
   e) patterning said thin metal layer;
   g) depositing a layer of heavy metal upon said thin metal layer;
   h) patterning and forming said heavy metal layer so each sensor element has a different mass;
   i) dividing said substrate into individual chips; and
   j) undercutting said spacer layer.

2. The process of claim 1 wherein said substrate is silicon.

3. The process of claim 1 wherein said addressing circuitry is CMOS and said electrical contacts are oxide.

4. The process of claim 1 wherein said spacer is a polymer.

5. The process of claim 1 wherein said thin metal is aluminum.

6. The process of claim 1 wherein said undercutting is a plasma etch.

7. The process of claim 1 wherein said heavy metal is tungsten.

8. The process of claim 1 wherein said patterning of the thin metal layer is done photolithographically.

* * * * *